(12) United States Patent
Kampl et al.

(10) Patent No.: US 9,755,639 B2
(45) Date of Patent: Sep. 5, 2017

(54) DEVICE AND METHOD FOR AN ELECTRONIC CIRCUIT HAVING A DRIVER AND RECTIFIER

(71) Applicant: Infineon Technologies Austria AG, Villach (AT)

(72) Inventors: Severin Kampl, Villach (AT); Matteo-Alessandro Kutschak, Ludmannsdorf (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/990,354

(22) Filed: Jan. 7, 2016

(65) Prior Publication Data

US 2016/0261266 A1 Sep. 8, 2016

Related U.S. Application Data

(60) Provisional application No. 62/127,063, filed on Mar. 2, 2015.

(51) Int. Cl.
*H03K 3/017* (2006.01)
*H03K 17/74* (2006.01)
*H03K 17/16* (2006.01)

(52) U.S. Cl.
CPC .......... *H03K 17/74* (2013.01); *H03K 17/165* (2013.01)

(58) Field of Classification Search
USPC ...... 327/109, 180, 427–428, 431; 363/21.14, 363/21.15, 97; 361/91.1, 93.9
See application file for complete search history.

(56) References Cited

U.S. PATENT DOCUMENTS

| | | | | |
|---|---|---|---|---|
| 5,757,629 A | * | 5/1998 | Yntema | H02M 3/1563 363/131 |
| 6,094,087 A | * | 7/2000 | He | H02M 1/4225 327/376 |
| 7,425,846 B2 | * | 9/2008 | Kim | G09G 3/296 326/109 |
| 7,714,548 B1 | * | 5/2010 | Wittenbreder, Jr. | H02M 1/083 323/235 |
| 8,558,587 B2 | * | 10/2013 | Machida | H02M 1/08 327/109 |
| 2004/0263219 A1 | * | 12/2004 | Ozaki | H03K 17/04123 327/112 |

* cited by examiner

*Primary Examiner* — An Luu
(74) *Attorney, Agent, or Firm* — Slater Matsil, LLP

(57) ABSTRACT

In accordance with an embodiment, a method includes driving a transistor device by a driver having an output coupled to a control node of the transistor through a capacitor and limiting a magnitude of a voltage of one polarity between the control node and a first load node of the transistor device by a rectifier circuit.

29 Claims, 4 Drawing Sheets

DEVICE AND METHOD FOR AN ELECTRONIC CIRCUIT HAVING A DRIVER AND RECTIFIER

This application claims the benefit of U.S. Provisional Application No. 62/127,063, filed on Mar. 2, 2015, which application is hereby incorporated herein by reference in its entirety.

TECHNICAL FIELD

This disclosure in general relates to an electronic circuit, in particular an electronic circuit including transistor device and a corresponding drive circuit.

BACKGROUND

High voltage switching transistors, such as power MOSFETs, junction field effect transistor (JFETs) and gallium nitride (GaN) high electron mobility transistor (HEMT), are commonly used as semiconductor switches in high voltage and high power devices such as switched-mode power supplies, motor controllers, and high voltage and high power switching circuits. Some of these devices, such as the GaN HEMT have the ability to be operated at very high voltages without the device breaking down or becoming damaged.

In many applications, a high voltage switching transistor is driven by a specialized driving circuit that produces switching voltages that are appropriate both for the particular application and for the particular technology of the switching transistor being driven. For example, a high side switching transistor that is referenced to a high voltage power supply node will often include a level shifting circuit that converts a ground referenced logic input level to a drive signal that is appropriately referenced to the high voltage power supply and has voltage levels that turns the high side switching transistor on and off.

A few parameters that specify the performance of high voltage switching transistor systems include turn-on time, turn-off time, blocking voltage, on-resistance and power consumption. In the design of systems that utilize high voltage switching transistors, there is often a tradeoff involved among these parameters. For example, in high voltage switching transistors that have a very high blocking voltage and low on-resistance, there is often a corresponding high input capacitance that results in higher power consumption when the high voltage switching transistor is driven in a manner to achieve fast turn-on and turn-off times.

SUMMARY

One embodiment relates to an electronic circuit. The electronic circuit includes a transistor device including a control node and a first load node, a driver having an input configured to receive an input signal and at least one output configured to provide a drive signal based on the input signal. A capacitor is coupled between the at least one output and the control node of the transistor device, and a rectifier circuit is connected between the first load node and the control node of the transistor device.

One embodiment relates to a drive circuit. The drive circuit includes an output including a first node configured to be connected to a gate node of a transistor device and a second node configured to be connected to a first load node of the transistor device, and a driver having an input configured to receive an input signal and at least one output configured to provide a drive signal based on the input signal. A capacitor is coupled between the at least one output of the driver and the first output node, and a rectifier circuit is connected between the second output node and the first output node.

One embodiment relates to a method. The method includes driving a transistor device by a driver having an output coupled to a control node of the transistor through a capacitor, wherein the driver is configured to provide a drive signal at the output based on an input signal, and limiting a magnitude of a voltage of one polarity between the control node and a first load node of the transistor device by a rectifier circuit.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
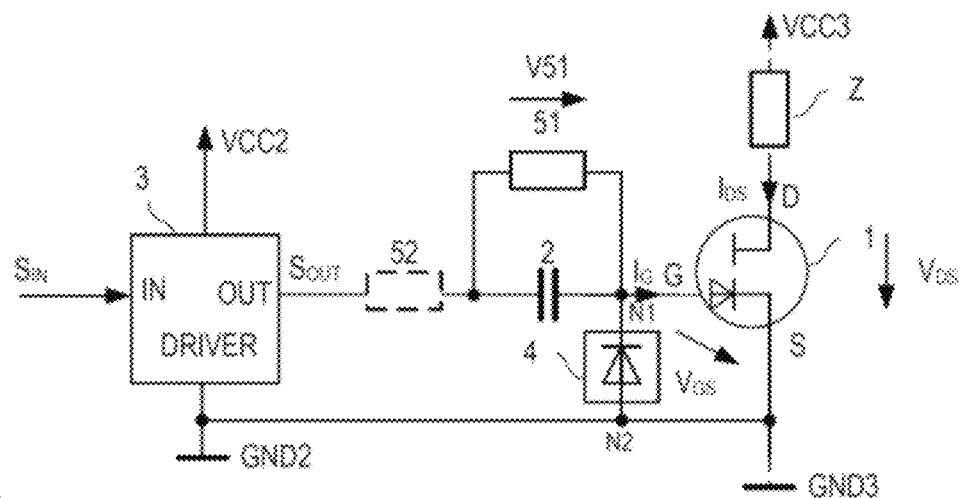
FIGS. 1A and 1B show two embodiments of an electronic circuit that include a transistor device and a drive circuit.

FIG. 1A shows one embodiment of an electronic circuit. The electronic circuit includes a transistor device 1 and a drive circuit configured to drive the transistor device 1. The drive circuit is connected to a control node G and a first load node S of the transistor device 1.

According to one embodiment, the transistor device 1 is a GaN GIT (Gallium Nitride Gate Injection Transistor). A GaN GIT is a GaN based normally-off transistor device, more specifically, a normally-off HEMT (High Electron Mobility Transistor). In this type of transistor device, the control node G is referred to as gate node, and the first load node S is referred to as source node. A GIT is a voltage controlled transistor device. That is, a GIT switches on or off dependent on a voltage level of a gate-source voltage $V_{GS}$ between the gate node G and the source node S. A p-type GIT, which is a GIT with a p-doped gate electrode, switches on when the gate-source voltage $V_{GS}$ is higher than a positive threshold voltage and switches off when the gate-source voltage $V_{GS}$ is below the threshold voltage. That is, the GIT is in the off-state, when the gate-source voltage $V_{GS}$ is 0 or negative. In the on-state, a steady current may flow into the gate node G in order to maintain the on-state and/or to reduce the on-resistance. For the purpose of the following explanation it is assumed that the transistor device is a GaN GIT with a p-doped gate electrode. It should be understood, however, that even though the various embodiments are described with respect to GaN transistors, embodiments of the present invention disclosed herein may utilize all types of transistor devices having wide-bandgap properties including, but not limited to Silicon-Carbide transistors and enhancement-mode GaN transistors.

Referring to FIG. 1A, the drive circuit includes a driver 3 with an input IN configured to receive an input signal $S_{IN}$ and an output OUT configured to provide an output signal $S_{OUT}$ based on the input signal $S_{IN}$. A capacitor 2 is coupled between the output OUT and the control node G of the transistor device 1. Furthermore, a first resistor 51 is connected in parallel with the capacitor 2. Optionally, a second resistor 52 (illustrated ion dashed lines) is connected between the output OUT of the driver 3 and the capacitor 2.

Referring to FIG. 1A, the drive circuit includes a rectifier circuit 4 connected between the control node G and the first load node S of the transistor device 1. The rectifier circuit 4, which may also be referred to as clamping circuit, is configured to limit (clamp) the magnitude of the gate-source voltage $V_{GS}$ when the gate-source voltage $V_{GS}$ has one polarity. According to one embodiment, the rectifier circuit 4 is configured to clamp a negative gate-source voltage $V_{GS}$. Rectifier circuit 4 may be integrated with transistor device 1, either monolithically or in the same IC package, or may be implemented external to transistor device 1.

Figure 2:
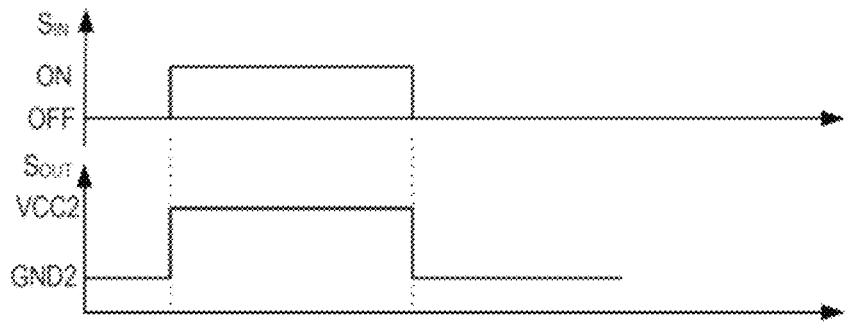
FIG. 2 shows timing diagrams that illustrate one way of operation of a driver in the drive circuit.

The driver 3 receives a first drive potential VCC2 and a second drive potential GND2. Referring to FIG. 2, which shows timing diagrams of the input signal $S_{IN}$ and the output signal $S_{OUT}$, the driver 3 may be configured to provide one of the first supply potential VCC2 and the second supply potential GND2 at the output OUT based on the input signal $S_{IN}$. Referring to FIG. 2, the input signal $S_{IN}$ may have one of two different signal levels, namely a first signal level, which will also be referred to as on-level in the following, and a second signal level, which will also be referred to as off-level in the following. According to one embodiment, the driver 3 is configured to provide, at the output OUT, the first drive potential VCC2 at the output OUT when the input signal $S_{IN}$ has an on-level and the second drive potential GND2 when the input signal $S_{IN}$ has the off-level. In the embodiment shown in FIG. 1A, the second supply potential GND2 corresponds to the electrical potential at the source node S of the transistor device 1. This second drive potential GND2 will also be referred to as ground potential in the following. As will be explained in further detail herein below, the driver 3 switches on the transistor device 1 when the input signal $S_{IN}$ has an on-level so that the first drive potential VCC2 is provided a the output OUT, and the driver 3 switches off the transistor device 1 when the input signal $S_{IN}$ has the off-level so that the second drive potential (ground potential) GND2 is provided at the output OUT. It should be further understood that in alternative embodiments of the present invention, the source of transistor device 1 and the second drive potential of driver 3 may be coupled to other potentials besides ground potential. For example, embodiments of the present invention may be applied to the high-side switch of a typical half-bridge configuration. In such an embodiment, the reference potential the source of transistor device 1 and the second drive potential of driver 3 would be coupled to a non-ground potential.

Figure 1B:
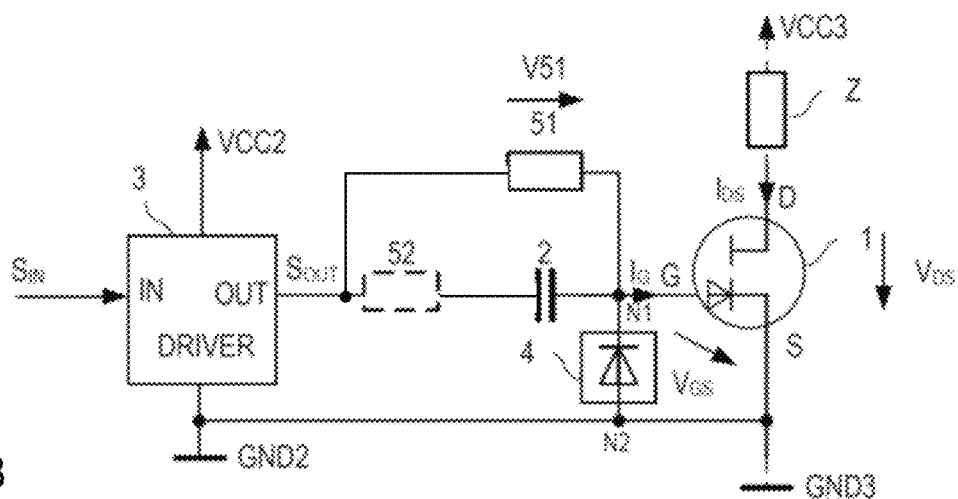

FIG. 1B illustrates an alternative embodiment of the electronic circuit of FIG. 1A. The embodiment of FIG. 1B is similar to the embodiment of FIG. 1A with the exception of resistor 51 being coupled in parallel with the series combination of optional resistor 52 and capacitor 2.

Figure 3:
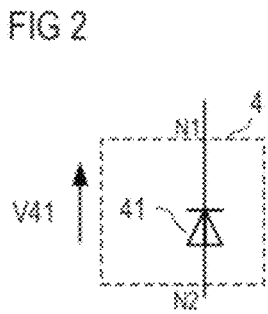
FIG. 3 shows one embodiment of a rectifier circuit in the drive circuit.
Figure 4:
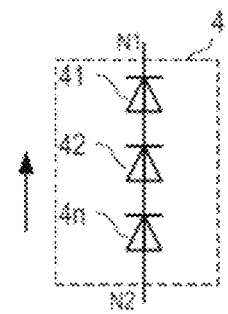
FIG. 4 shows one embodiment of a rectifier circuit in the drive circuit.
Figure 5:
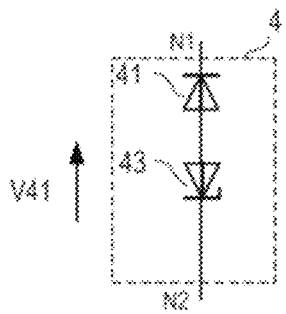
FIG. 5 shows one embodiment of a rectifier circuit in the drive circuit.

FIGS. 3-5 show different embodiments of how the rectifier circuit (clamping circuit) 4 may be implemented. According to FIG. 3, the rectifier circuit 4 includes one bipolar diode 41. In this embodiment, a cathode of the bipolar diode 41 is connected to a first circuit node N1 of the rectifier circuit 4, and an anode is connected to a second circuit node N2 of the rectifier circuit 4. Referring to FIGS. 1A and 1B, the first circuit node N1 of the rectifier circuit 4 is connected to the gate node G, and the second circuit node N2 is connected to the source node S. A clamping voltage of this rectifier circuit 4 corresponds to a forward voltage of the bipolar diode 41. The "clamping voltage" is the maximum voltage level of a voltage V41 between the second node N2 and the first circuit node N1. This clamping voltage V41 defines to what extent the electrical potential at the gate node G can fall below the electrical potential at the source node S. That is, the clamping voltage V41 defines how negative the gate-source voltage $V_{GS}$ can become.

FIG. 4 shows another embodiment of the rectifier circuit 4. In this embodiment, the rectifier circuit 4 includes a plurality of bipolar diodes 41, 42, 4n connected in series. In this embodiment, the clamping voltage V41 is defined by the sum of the forward voltages of the bipolar diodes connected in series. In the embodiment shown in FIG. 4 there are three bipolar diodes connected in series. However, this is only an example. Any number of bipolar diodes can be connected in series in order to suitably adjust the clamping voltage V41.

FIG. 5 shows another embodiment of a rectifier circuit 4. In this embodiment the rectifier circuit 4 includes a bipolar diode 41 and a Zener diode 43 connected in a back-to-back configuration. In this embodiment, the clamping voltage V41 is given by the forward voltage of the bipolar diode 41 plus the Zener voltage of the Zener diode 43. It should be understood that the rectifier circuits of FIGS. 3, 4 and 5 are only examples of many possible embodiment rectifier circuits that may be used in embodiment circuits.

Figure 6:
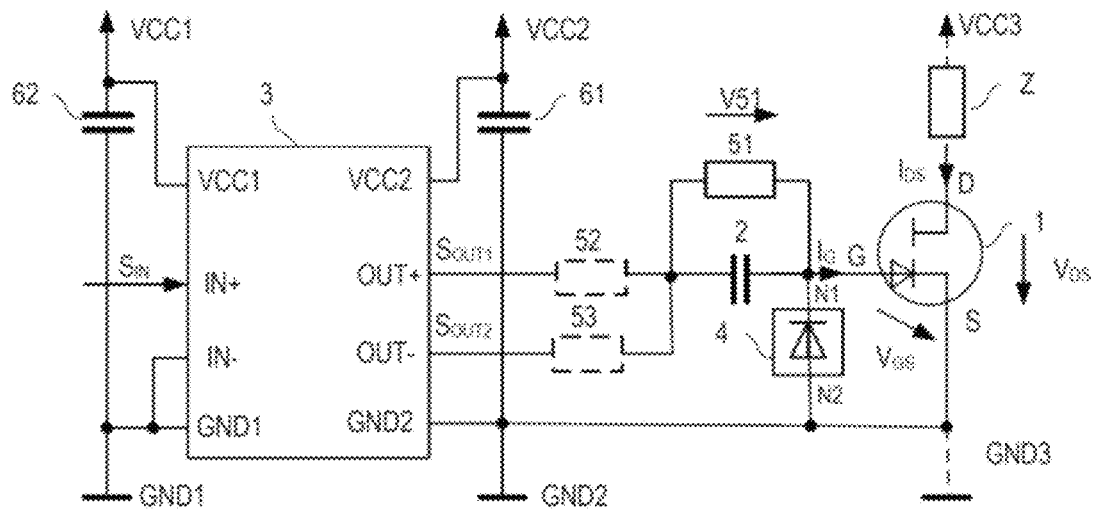
FIG. 6 shows another embodiment of an electronic circuit including a transistor device and a drive circuit.

FIG. 6 shows another embodiment of an electronic circuit with a transistor device 1 and a drive circuit for driving the transistor device 1. In this embodiment, the driver 3 has a first output OUT+ and a second output OUT−. The driver 3 is configured to provide a first drive signal $S_{OUT1}$ at the first output OUT+ and a second drive signal $S_{OUT2}$ at the second output OUT−based on an input signal $S_{IN}$ received at a first input IN+. Each of the first output OUT+ and the second output OUT− is coupled to the capacitor 2. Optionally, a second resistor 52 is connected between the first output OUT+ and the capacitor 2, and a third resistor 53 is connected between the second output OUT− and the capacitor 2. A capacitor 61 that is connected between those terminals where the driver 3 receives the first drive potential VCC2 and the second drive potential GND2, respectively, is optional and may help to stabilize the drive potentials.

Referring to FIG. 6, the driver 3 further receives a first supply potential VCC1 and the second supply potential GND1. A capacitor 62 between those circuit nodes where these supply potentials VCC1, GND1 are available is optional. A supply voltage, which is a voltage between the first supply potential VCC1 and the second supply potential GND1, supplies circuitry inside the driver 3.

According to one embodiment, the driver 3 is configured to provide the first drive potential VCC2 at the first output OUT+ when the input signal $S_{IN}$ has a first level (on-level). In this operation mode, the second output OUT− is high-ohmic. When the input signal $S_{IN}$ has the second level (off-level) the driver 3 provides the second drive potential GND2 at the second output OUT− while the first output OUT+ is high-ohmic. In alternative embodiments, second drive potential GND2 and source potential GND3 of transistor 1 may be referenced to other potentials besides ground.

According to one embodiment, the driver 3 is an integrated driver of the type 1EDI60N12AF available from Infineon Technologies AG, Munich. For example, the supply voltage is 5V, the drive voltage, which is the voltage between the first supply potential VCC2 and the second supply potential GND2, is 15V, a capacitance of the capacitor 61 stabilizing the drive voltage is 1 microfarad (μF), and a capacitance of a capacitor 62 stabilizing the supply voltage is 100 nanofarad (nF). For example, a resistance R51 of the first resistor 51 is between several hundred ohms and several kiloohms, such as 1 kiloohm (kΩ). Resistances R52, R53 of the optional second resistor 52 and the optional resistor 53, respectively, are in the range of several ohms. For example, R52 is 4.7 ohm (Ω) and R53 is 3.3 ohm (Ω). A capacitance C2 of the capacitor 2 may be in the range of several microfarads. For example, C2 is 3.3 microfarad (μF). In alternative embodiments, other drive circuits and component values may be used.

Figure 7:
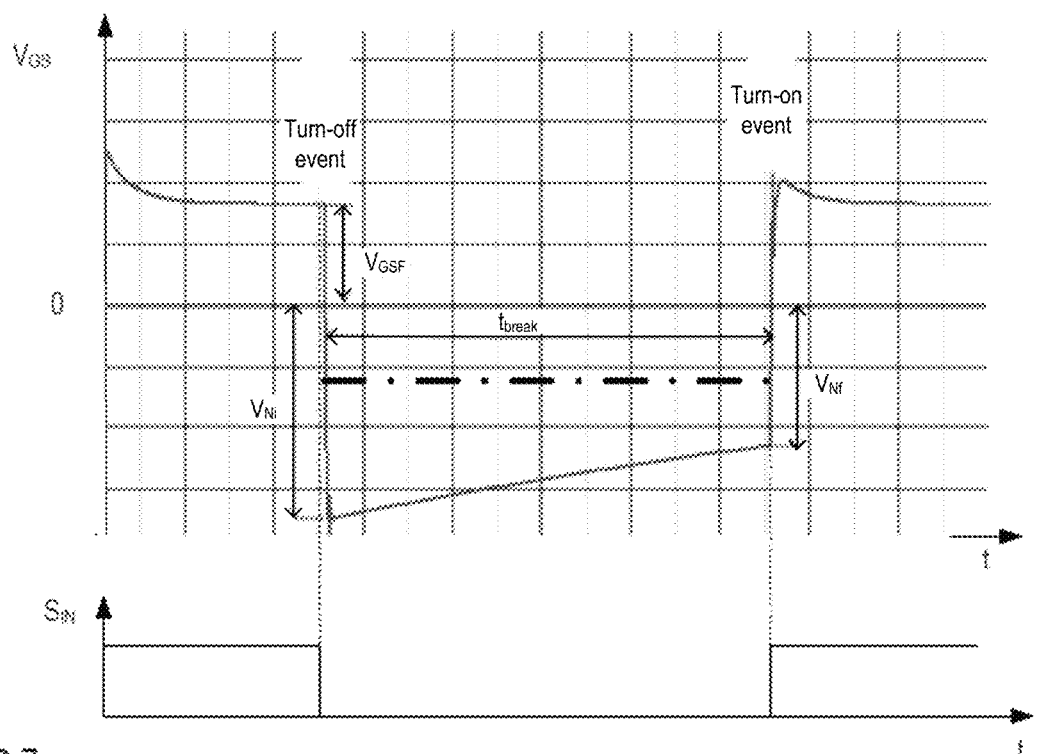
FIG. 7 shows timing diagrams that illustrate one way of operation of an electronic circuit with a conventional drive circuit and of one of the electronic circuits shown in FIGS. 1 and 6.

One way of operation of the electronic circuits shown in FIGS. 1 and 6 is explained with reference to FIG. 7 herein below. FIG. 7 shows timing diagrams of the gate-source voltage $V_{GS}$ and the input signal $S_{IN}$. When the input signal $S_{IN}$ switches to the on-level so that the driver 3 provides the first drive potential VCC2 at the output OUT (FIGS. 1A and 1B) and the first output OUT+ (FIG. 6), respectively, the capacitor 2 provides for a rapid increase of the electrical potential at the gate node G so as to rapidly switch on the transistor device 1. Referring to the above, in the on-state, a steady gate current $I_G$ may flow into the gate node of the GIT. This gate current $I_G$ is provided by the driver 3 to the gate node G via the first resistor 51 and the optional second resistor 52. In the steady on-state of the transistor device 1, the voltage level of the gate-source voltage $V_{GS}$ is given by VCC2−V51, where V51=R51·$I_G$, where R51 is the resistance of the first resistor 51 and $I_G$ is the gate current $I_G$. According to one embodiment, R51>>R52 so that the optional second resistor 52 has no significant influence on the voltage level of the gate-source-voltage $V_{GS}$ in the on-state. This optional resistor 52 defines the slope of a rising edge of the electrical potential at the gate node G, whereas this slope decreases as the resistance of the resistor 52 increases. For example, the first supply potential VCC2, the resistance R51 and the gate current $I_G$ are designed such that voltage level of the gate-source voltage $V_{GS}$ in the on-state is several volts such as, for example, between 4V and 6V.

When the input signal $S_{IN}$ switches to the off-level so that the driver 3 provides the second drive potential GND2 at the output OUT (FIGS. 1A and 1B) and the second output OUT− (FIG. 6), respectively, the gate-source-voltage $V_{GS}$ becomes negative so that the transistor device switches off. FIG. 7, in solid lines, illustrates the gate-source voltage $V_{GS}$ in a conventional circuit that does not include a rectifier circuit and, in dashed lines, illustrates the gate-source voltage $V_{GS}$ in one of the electronic circuits according to FIGS. 1 and 6. In both cases, during the on-state, the capacitor 2 has been charged to V51$_{ON}$=R51·$I_G$.

As a first approximation, in the conventional circuit, the gate-source-voltage $V_{GS}$ at the beginning of the off-state is −V51$_{ON}$. This scenario is shown in solid lines in FIG. 7. During the off-state, there is no gate current into the transistor device 1. During this off-state, the first resistor 51 gradually discharges the capacitor 2 so that the gate potential slowly increases (the voltage level of the negative gate-source voltage $V_{GS}$ slowly decreases). In FIG. 7, $V_{Nf}$ denotes the voltage level of the gate-source voltage $V_{GS}$ immediately before the transistor device 1 again switches on. This voltage level $V_{Nf}$ is dependent on the duration of the off-state of the transistor device 1. This duration is referred to as $t_{break}$ in FIG. 7. The voltage level $V_{Nf}$ affects the losses that occur when the transistor device 1 switches on, where the losses are the higher the higher the voltage level $V_{Nf}$ is. As $V_{Nf}$ is dependent on the duration of the off-state, switching losses at turn-on of the transistor device—in a conventional electronic circuit without rectifier circuit 4—are a function of the duty cycle which is highly undesirable.

Furthermore, a GaN HEMT is capable of conducting a current in a reverse direction through an internal channel. In the transistor device shown in FIGS. 1 and 6, a current $I_{DS}$ flowing in the reverse direction is a current having a current flow direction that is opposite the direction indicated in FIGS. 1 and 6. The voltage drop across the transistor device 1 when operated in the reverse direction depends on the difference between a (positive) threshold voltage of the transistor device and a (negative) gate-source voltage $V_{GS}$ applied between the gate node G and the source node S in the off-state, whereas the more negative the gate-source voltage $V_{GS}$ is, the higher will be the conduction losses in reverse direction. Dependent on the magnitude of the negative level of the gate-source voltage $V_{GS}$ the voltage drop (drain-source voltage) $V_{DS}$ may reach several volts, which may lead to significant losses. For example, the transistor device 1 may be employed in a synchronous rectifier application where the transistor device is operated in the reverse conduction mode before turning on the transistor device 1. At a high voltage drop in the reverse conduction mode even relatively short dead times of, e.g., 100 ns of operating the transistor device in the reverse direction may have a big influence on the total losses. It is therefore desirable to provide a negative gate-source voltage such that the gate-source voltage is negative enough to prevent spurious turn-on of the transistor device but, nevertheless, does not result in significant switching losses and conduction losses during reverse operation. This is achieved by employing the rectifier circuit 3 in the electronic circuit.

The behavior of the electronic system with the rectifier circuit 4 is illustrated in dashed and dotted lines in FIG. 7. In this case, the negative voltage level of the gate-source voltage $V_{GS}$ is limited by the rectifier circuit 4. That is, at the beginning of the off-time, the rectifier circuit 4 partially discharges the capacitor 2. During the off-time, the first resistor 51 may further discharge the capacitor. However, by virtue of clamping the negative voltage level of the gate-source voltage $V_{GS}$ to a level that is significantly lower than in a conventional system, variations of the gate-source voltage $V_{GS}$, even during long off-states, are significantly lower than in a conventional system. Thus, losses that occur at switching on the transistor device do not vary significantly and are less dependent on the duty cycle.

According to one embodiment, the clamping voltage of the rectifier circuit 41 is between −0.5 V and −1.5 V. According to one embodiment, the transistor device 1 has a voltage blocking capability of 600 V and a maximum on-resistance of about 70 milliohm.

Figure 8:
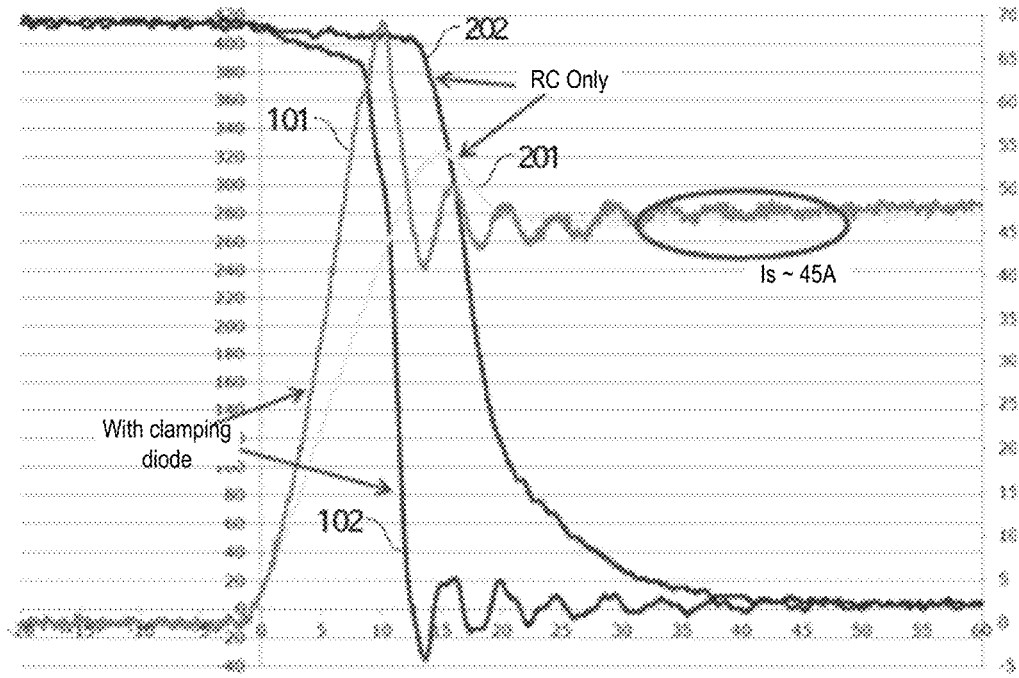
FIG. 8 shows timing diagrams of a drain-source voltage and a drain-source current of a transistor device driven by a conventional drive circuit and of a transistor device driven by one of the drive circuits shown in FIGS. 1 and 6.

FIG. 8 shows timing diagrams that illustrate one way of operation of the transistor device 1 in one of the electronic circuit shown in FIGS. 1 and 6. For the purpose of explanation it is assumed that the drain-source path D-S of the transistor device 1 is connected in series with a load Z, wherein the series circuit with the transistor device and the load Z is connected between load supply terminals where a load supply voltage is available. FIG. 8 shows timing diagrams of a drain-source current $I_{DS}$ and a drain-source voltage $V_{DS}$ of the transistor device 1 in one of the electronic systems according to FIGS. 1 and 6, and in a conventional electronic circuit without rectifier circuit 4. In FIG. 8, curve 101 shows the drain-source current and curve 102 shows the drain-source voltage in one of the systems according to FIGS. 1 and 6. For comparison, curve 201 shows the drain-source current and curve 202 shows the drain-source voltage in a conventional system. As can be seen from FIG. 8, clamping the gate-source voltage $V_{GS}$ by the rectifier circuit 4 results in a switching of the transistor device 1, that is, in a faster increase of the drain-source current and, consequently, a faster decrease of the drain-source voltage, as compared to a conventional system.

Figure 9:
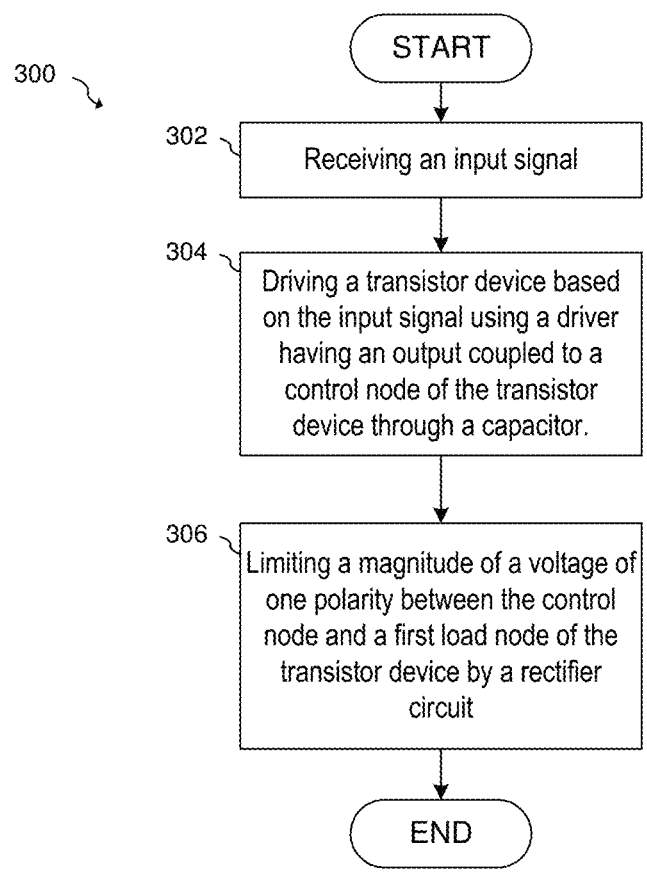
FIG. 9 illustrates a block diagram of an embodiment method.

FIG. 9 illustrates a block diagram of an embodiment method 300. In an embodiment, a driver circuit receives an input signal (step 302). The driver circuit has an output coupled to a control node of a transistor device, and may be implemented, for example using embodiment systems described above. Next, the driver circuit drives the transistor based on the received input signal (step 304). In step 306, a magnitude of a voltage of one polarity between the control node and a first load node of the transistor device is limited using a rectifier circuit. Such a rectifier may be implemented, for example, using the circuits of FIG. 3, 4 or 5.

Embodiments of the present invention are summarized here. Other embodiments can also be understood from the entirety of the specification and the claims filed herein. One general aspect includes an electronic circuit having a transistor device including a control node and a first load node; a driver having an input configured to receive an input signal and at least one output configured to provide a drive signal based on the input signal; a capacitor coupled between the at least one output and the control node of the transistor device; and a rectifier circuit connected between the first load node and the control node of the transistor device.

Implementations may include one or more of the following features. The electronic circuit where the transistor device has wide band-gap properties. In some embodiments, the transistor device is a GaN device, which may be implemented, for example, using a GaN device such as a GaN GIT device, and the control node is a gate node and the first load node is a source node. The electronic circuit may further include a first resistor connected in parallel with the capacitor and may optionally include a second resistor coupled between the at least one output and the first resistor. In another embodiment, the electronic circuit further includes a first resistor and a second resistor, such that the second resistor is coupled in series with the capacitor to form a series circuit, and the first resistor is coupled in parallel with the series circuit. In some embodiments, the rectifier circuit includes at least one bipolar diode, a plurality of bipolar diodes connected in series or a series circuit with a bipolar diode and a Zener diode connected back-to-back. In some embodiments, the rectifier is integrated with the transistor device.

In an embodiment, the driver includes a first output configured to provide a first drive signal based on the input signal and a second output configured to provide a second drive signal based on the input signal, where each of the first output and the second output is coupled to the capacitor. The electronic circuit may further include a second resistor connected between the first output and the capacitor. In some embodiments, the electronic circuit includes a third resistor connected between the second output and the capacitor.

In some embodiments, a reference terminal of the driver and a reference terminal are coupled to a reference node. This reference node may be a ground node or another node.

Another general aspect includes a drive circuit having an output including a first output node configured to be connected to a gate node of a transistor device and a second output node configured to be connected to a first load node of the transistor device; a driver having an input configured to receive an input signal and at least one output configured to provide a drive signal based on the input signal; a capacitor coupled between the at least one output of the driver and the first output node; and a rectifier circuit connected between the second output node and the first output node.

Implementations may include one or more of the following features. The drive circuit further including a first resistor connected in parallel with the capacitor. The rectifier circuit may include at least one bipolar diode, a plurality of bipolar diodes connected in series or a series circuit with a bipolar diode and a Zener diode connected back-to-back. The driver may include a first output configured to provide a first drive signal based on the input signal and a second output configured to provide a second drive signal based on the input signal, where each of the first output and the second output is coupled to the capacitor. In some embodiments, the drive circuit further includes a second resistor connected between the first output and the capacitor. The drive circuit may also include a third resistor connected between the second output and the capacitor.

A further general aspect includes a method that includes driving a transistor device by a driver having an output coupled to a control node of the transistor device through a capacitor and limiting a magnitude of a voltage of one polarity between the control node and a first load node of the transistor device by a rectifier circuit. The driver is configured to provide a drive signal at the output based on an input signal.

Implementations may include one or more of the following features. The method where the transistor device has wide-bandgap properties. For example, the transistor device may be a GaN device. In some embodiments, the GaN device may be a GaN GIT device. In an embodiment, the voltage of the one polarity is a negative voltage between the control node and the first load node.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit, comprising:
   a transistor device comprising a control node and a first load node;
   a driver having an input configured to receive an input signal and at least one output comprising a first output configured to provide a first drive signal based on the input signal, and a second output configured to provide a second drive signal based on the input signal;
   a capacitor coupled between the at least one output and the control node of the transistor device, wherein each of the first output and the second output is coupled to the capacitor; and
   a rectifier circuit connected between the first load node and the control node of the transistor device.

2. The electronic circuit of claim 1, wherein the rectifier circuit is integrated with the transistor device.

3. The electronic circuit of claim 1, wherein the transistor device has wide-bandgap properties.

4. The electronic circuit of claim 3, wherein the transistor device is a GaN device, the control node is a gate node and the first load node is a source node.

5. The electronic circuit of claim 4, wherein the GaN device is a GaN GIT device.

6. The electronic circuit of claim 1, further comprising a first resistor connected in parallel with the capacitor.

7. The electronic circuit of claim 6, further comprising a second resistor coupled between the at least one output and the first resistor.

8. The electronic circuit of claim 1, further comprising a first resistor and a second resistor, wherein the second resistor is coupled in series with the capacitor to form a series circuit, and the first resistor is coupled in parallel with the series circuit.

9. The electronic circuit of claim 1, wherein the rectifier circuit comprises at least one bipolar diode.

10. The electronic circuit of claim 1, wherein the rectifier circuit comprises a plurality of bipolar diodes connected in series.

11. The electronic circuit of claim 1, wherein the rectifier circuit comprises a series circuit with a bipolar diode and a Zener diode connected back-to-back.

12. The electronic circuit of claim 1, further comprising:
    a first resistor coupled in parallel with the capacitor;
    a second resistor coupled between the first output and the capacitor; and
    a third resistor coupled between the second output and the capacitor.

13. The electronic circuit of claim 1, further comprising a second resistor connected between the first output and the capacitor.

14. The electronic circuit of claim 1, further comprising a third resistor connected between the second output and the capacitor.

15. The electronic circuit of claim 1, wherein a reference terminal of the driver and a reference terminal are coupled to a reference node.

16. The electronic circuit of claim 15, wherein the reference node is a ground node.

17. A drive circuit, comprising:
    an output comprising a first output node configured to be connected to a gate node of a transistor device and a second output node configured to be connected to a first load node of the transistor device;
    a driver having an input configured to receive an input signal and at least one output configured to provide a drive signal based on the input signal, wherein the driver comprises a first output configured to provide a first drive signal based on the input signal and a second output configured to provide a second drive signal based on the input signal;
    a capacitor coupled between the at least one output of the driver and the first output node, wherein each of the first output and the second output is coupled to the capacitor; and
    a rectifier circuit connected between the second output node and the first output node.

18. The drive circuit of claim 17, further comprising:
    a first resistor connected in parallel with the capacitor.

19. The drive circuit of claim 17, wherein the rectifier circuit comprises at least one bipolar diode.

20. The drive circuit of claim 17, wherein the rectifier circuit comprises a plurality of bipolar diodes connected in series.

21. The drive circuit of claim 17, wherein the rectifier circuit comprises a series circuit with a bipolar diode and a Zener diode connected back-to-back.

22. The drive circuit of claim 17, further comprising:
    a first resistor coupled in parallel with the capacitor;
    a second resistor coupled between the first output and the capacitor; and
    a third resistor coupled between the second output and the capacitor.

23. The drive circuit of claim 17, further comprising:
    a second resistor connected between the first output and the capacitor.

24. The drive circuit of claim 17, further comprising:
    a third resistor connected between the second output and the capacitor.

25. A method, comprising:
    driving a transistor device by a driver having an output coupled to a control node of the transistor device through a capacitor, wherein the driver is configured to provide a drive signal at the output based on an input signal, the driver comprises a first output configured to provide a first drive signal based on the input signal and a second output configured to provide a second drive signal based on the input signal, and each of the first output and the second output is coupled to the capacitor; and limiting a magnitude of a voltage of one polarity between the control node and a first load node of the transistor device by a rectifier circuit.

26. The method of claim 25, wherein the transistor device has wide-bandgap properties.

27. The method of claim 26, wherein the transistor device is a GaN device.

28. The method of claim 27, wherein the GaN device is a GaN GIT device.

29. The method of claim 25, wherein the voltage of the one polarity is a negative voltage between the control node and the first load node.

* * * * *